United States Patent Office 3,309,202

Patented Mar. 14, 1967

3,309,202

PRINTING PLATE COATING COMPOSITIONS

Julius L. Silver, Somerset, N.J., assignor to Union Carbide Corporation, a corporation of New York No Drawing. Filed Sept. 10, 1964, Ser. No. 395,559

20 Claims. (Cl. 96—85)

This invention relates to photomechanical reproduction and improvements therein. In a particular aspect, this invention relates to resin coating compositions useful for the preparation of photosensitive polymeric surfaced planographic printing plates.

At the present time virtually all printed copy is produced through the use of three basic types of printing plates. One type is a relief plate which prints from a raised surface. Another type is an intaglio plate which prints from a depressed surface. The third type is the planographic plate which prints from a flat surface which is neither raised above nor depressed below the adjacent and surrounding non-printing area.

Planographic printing plates have water-repellent (hydrophobic), oil-receptive (oleophilic) image areas, and water-receptive (hydrophilic) non-image areas. Offset lithography is the most widely known printing method which employs planographic printing plates. One type of lithographic plate is prepared by applying a thin coating of a diazo dye to a suitable support material, exposing the coating to the action of light passing through a negative of the picture to be printed causing the diazo coating to become cross-linked and hence water-repellent and oil receptive to the image area, and then washing away the unexposed, unreated coating with a suitable developer. Since the plate support material is itself water-receptive, those portions of the plate from which the unreacted coating has been removed by the developer solution become the non-image area.

On diazo-type lithographic printing plates made as described above, all portions of the image area accept and print the same amount of ink per unit of area, and all parts of the non-image area totally reject the greasy printing ink. Consequently, in order to obtain gradations in tone or intermediate shades of color or tints, it has been generally necessary to use the so-called "half-tone dot structure" printing plate. In this process the printing plate, and the corresponding picture reproduced therefrom, are broken down into myriad dots by using half-tone negatives during exposure of the printing plate. While each individual dot prints with the same color intensity, the effect of tones and shades is created by virtue of different sizes of dots in the various parts of the printing plate and the printed picture produced therefrom. Diazo-type lithographic printing plates are not durable in that the image areas gradually abrade with normal press-room practice. Various lacquers and other coatings are sometimes employed to retard the rate of wearing down of image areas. There is also a tendency for metal base planographic printing plates to kink and scratch.

The non-image areas of the lithographic plates are the exposed grained zinc or aluminum surface of the base. The exposed metal areas are water-receptive. These exposed metal non-image areas suffer loss of water receptivity because corrosion and pitting occur.

Practically all metal base planographic printing plates depend on some graininess in the surface to enhance the water carrying ability of the non-image areas. This grain is deleterious to the reproduction of dot structures in half-tone printing since the grain breaks up the dots themselves.

There is another planographic printing method, known as Collotype, which is unique among the presently known printing processes in that it provides continuous tone reproduction. In this latter process, the support material for the planographic plates is coated with a photosensitive gelatin which is initially soft and hydrophilic, but it becomes progressively harder and less hydrophilic when acted upon by light. Thus, when the coated plate is exposed to light through a negative, it appears that each area of the coating hardens in proportion to the amount of light which it requires and consequently it becomes proportionally less hydrophilic. As a result, the various parts of the exposed coating accept water in an amount inversely proportional to the intensity of light they received, and accept a complimentary amount of ink in an amount directly proportional to the intensity of light which has acted upon the area.

Two deficiencies of the Collotype process stem largely from the inherent shortcomings of the photosensitive gelatin itself. Collotype printing plates can be used for only a few thousand reproductions due to the weakness of the gelatin. It is difficult to obtain prints of the same color density throughout a press run because the gelatin absorbs and releases water too rapidly, and the total water absorption capacity of the gelatin, which depends upon a a highly critical "tanning" step, is not easily controllable nor reproducible.

It is therefore an object of the present invention to provide planographic printing plates having printing surfaces which do not pit and corrode, and are more durable than metal surfaced lithographic plates.

It is another object of the present invention to provide coating compositions which are easily applied to a substrate support and which can after application be photosensitized.

It is still another object of the present invention to provide planographic printing plates which can be exposed and employed directly in lithographic printing operations without processing the plate with developing inks, image intensifiers, and the like.

It is a further object of the present invention to provide photosensitive resin compositions useful as photosensitive planographic plates, which are tougher and more durable than gelatin base plates employed in Collotype continuous tone printing.

It is another object of the present invention to provide planographic printing plates upon which can be formed continuous tone exposures and then employed directly in printing operations without any developing procedure.

It is another object of the present invention to provide continuous tone planographic plates which permit control of color density and uniformity of reproduction.

It is another object of the present invention to provide planographic printing plates which can be used to reproduce pictures with good color purity and well-defined boundaries by the half-tone technique.

Other objects and advantages of the present invention will become apparent to those skilled in the art from the accompanying description and disclosure.

In accordance with the present invention it has been found that one or more of the aforementioned objects are accomplished through the utilization of a coating composition comprising (1) the association product of a phenolic resin and from about 0.2 to 3.0 parts by weight of an ethylene oxide polymer per part phenolic resin, (2) from about 0.006 to about 0.05 part by weight per part phenolic resin of an organic sulfonic acid, (3) from about 0.025 to about 0.2 part by weight per part phenolic resin of a water soluble inorganic bichromate, (4) from about 0.025 to about 0.13 part by weight per part phenolic resin of a polyhydric phenol selected from the group consisting of phloroglucinol and resorcinol, and (5) a suitable solvent.

This coating composition is not photosensitive. However, when the coating solution is applied to a suitable substrate, is dried and then baked at an elevated temperature, the resultant coating can be photosensitized by surface application of a suitable photosensitizing agent.

It is another embodiment of this invention to provide a photosensitizable printing plate base comprising a suitable substrate having coated on its surface the dried and baked coating solution of this invention.

It is still another embodiment of this invention to provide a photosensitized printing plate comprising the photosensitizable printing plate base of this invention coated with a suitable photosensitizing agent.

The ethylene oxide polymer component of the compositions of this invention is seletced from the resinous ethylene oxide polymeric materials having an average molecular weight in the range of from about 50,000 to about 10,000,000, which are readily soluble in water. The term "ethylene oxide polymers" refers to polymers possessing the repeating unit ($CH_2$—$CH_2O$—) as represented by the class of commercial Polyox resins; and the term is intended to include water soluble ethylene oxide polymer resins wherein ethylene oxide is the predominant monomer polymerized therein but which also contain polymerized residues of other olefin oxides as exemplified by copolymers and terpolymers of ethylene oxide with other copolymerizable monomers containing single epoxide groups such as propylene oxide, butylene oxide, styrene oxide and the like. Poly(ethylene oxide) homopolymer is however preferred as the ethylene oxide polymer resin and shall be used hereinafter as representative of these resins.

The phenolic resin component of the compositions of the present invention are the heat fusible condensation products of a phenol with an aldehyde. Such condensation products are divided into two classes, resoles and novolaks, either of which can be used in this invention as shown hereinafter. These two types of resins are discussed in order below. Both of these classes of phenolic resins will form in association with ethylene oxide polymers.

While these phenolic resins are in the fusible form when making the association product (as hereinafter more clearly set forth) the fusible condition is not necessarily a critical condition of the association product, in which it is possible for a portion or all of the phenolic resin component be fully advanced to the cured state.

The fusible resole phenolic resins can advance upon heating to a degree of cure and polymerization to attain a completely insoluble state. These insoluble phenolics cannot be used in the preparation of the present compositions but are believed to be present in the cured printing plate compositions of this invention. In the preparation of the present compositions only those heat fusible phenolic resins which are soluble in water, alkali or organic solvents such as acetone, ethanol and the like and which are sufficiently fusible to permit admixture and association with the ethylene oxide polymers can be used. These resins include those resole phenolic resins which have not cured to a degree of insolubility as well as the novolak resins discussed below.

RESOLE RESINS

Resole resins, are generally produced by the condensation of phenols and aldehydes under alkaline conditions. Resoles differ from novolaks in that polynuclear methylol-substituted phenols are formed as intermediates in resoles. A resole produced by the condensation of phenol with formaldehyde most likely proceeds through an intermediate having the following illustrated type structure:

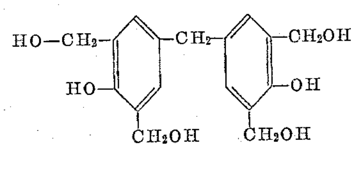

In a typical synthesis, resoles are prepared by heating one mole of phenol with 1.5 moles of formaldehyde under alkaline conditions.

The resole resins are prepared by the condensation of phenol with formaldehyde or, more generally, by the reaction of a phenolic compound, having two or three reactive aromatic ring hydrogen positions, with an aldehyde or aldehyde-liberating compound capable of undergoing phenol-aldehyde condensation. Illustrative of phenolic compounds are cresol, xylenol, ethylphenol, butylphenol, isopropylmethoxyphenol, chlorophenol, resorcinol, hydroquinone, naphthal, 2,2-bis(p-hydroxyphenyl)propane, and the like. Illustrative of aldehydes are formaldehyde, acetaldehyde, acrolein, crotonaldehyde, furfural, and the like. Illustrative of aldehyde-liberating compounds are for example, paraformaldehyde, formalin and 1,3,5-trioxane. Ketones such as acetone are also capable of condensing with phenolic compounds, as are methylene engendering agents such as hexamethylenetetramine.

The condensation of phenolic compound and aldehyde is conducted in the presence of alkaline reagents such as sodium carbonate, sodium acetate, sodium hydroxide, ammonium hydroxide, and the like. When the condensation reaction is completed, if desired the water and other volatile materials can be removed by distillation, and the catalyst neutralized.

NOVOLAK RESINS

The novolak resins are prepared in a manner similar to that used to prepare the resole resins. The distinguishing exception in this preparation is however that the reaction is generally conducted in an acidic media, instead of an alkaline media as is the case with the resoles. When less than six moles of formaldehyde are used per seven moles of phenol the products are permanently fusible and soluble. These are the novolak resins. The novolaks have a different structure than the resoles as is illustrated by the novolak condensation products of phenol with formaldehyde:

(*a*)

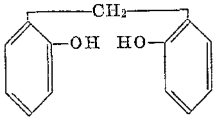

(*b*)

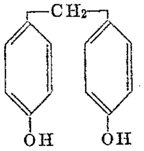

(*c*)

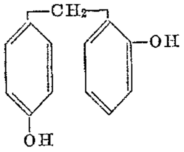

The novolaks can be further reacted with formaldehyde or with a methylol yielding compound such as hexamethylene tetramine, to a state of cure which is similar in the nature to the curing pattern of the resoles.

In a typical synthesis novolaks are prepared by heating one mole of phenol with 0.5 mole of formaldehyde under acidic conditions. The temperature at which the reaction is conducted is generally from about 25° C. to about 175° C.

The reactants which can be used in the preparation of the novolaks are the same as those used in the preparation of the resoles which are described and listed above.

While as previously stated both the resole resins and the novolak resins can be employed in the compositions of the present invention, it is preferred to use the resole resins, as printing plates formed from compositions utilizing them give sharper prints and have a longer printing life.

The most suitable fusible resole resins are those which are insoluble in water but readily soluble in conventional organic solvents such as methyl ethyl ketone, acetone, methanol, ethanol, and the like. Resole resins having a particularly desirable combination of properties are those which have an average molecular weight in the range between about three hundred fifty and six hundred. It is believed that these resole resins contain an average of at least one methylol group per aromatic nucleus.

The term organic sulfonic acid is intended to include sulfonic acids containing from one to 12 carbon atoms per molecule. Illustrative of such organic sulfonic acids are the alkane sulfonic acids such as methane sulfonic acid, ethane sulfonic acid, propane sulfonic acid, butane sulfonic acid, hexane sulfonic acid, decane sulfonic acid, dodecane sulfonic acid and the like; the aromatic sulfonic acids such as benzene sulfonic acid, phenyl methane sulfonic acid, toluene sulfonic acids, naphthalene sulfonic acids, biphenyl sulfonic acid and the like; the alkylene sulfonic acids such as ethylene sulfonic acid, tetramethylene sulfonic acid, hexamethylene sulfonic acid and the like; and the arylene disulfonic acids such as benzene disulfonic acid, toluene disulfonic acid and the like.

The preferred sulfonic acid components of the compositions of this invention are the aromatic sulfonic acids. The most preferred are the toluene sulfonic acids such as p-toluene sulfonic acid. This preference is dictated by the outstandingly extended continuous tone which these acids provide to the printing plates of this invention.

The sulfonic acid component of this invention generally serves with the bichromate component to extend the printing plate density scale of the planographic printing plates. The combined effect of these ingredients is particularly noticeable in continuous tone printing although the compositions of this invention provide excellent half-tone planographic printing plates as well.

The water-soluble bichromate components of the coating compositions of this invention serve to increase the effect of the photosensitizing agents of this invention after application to the baked printing plate surface coating. As indicated above the bichromate component in the presence of the sulfonic acid component serves to extend the printing plate scale in continuous tone printing. The bichromates which are used in the compositions of this invention are those having the formula $$(M)_2Cr_2O_7$$

wherein M is an alkali metal or an ammonium ion. It should be noted that ammonium ion, while not per se an alkali metal, behaves so similarly to the alkali metals that it is generally included within discussions of the alkali metal ions and salts and can be considered to be included within this invention. For the purposes of the present discussion ammonium ion is considered to be equivalent to an alkali metal ion and is intended to be included within the scope of this invention. Illustrative of the alkali metal ions are sodium, potassium, ammonium and the like. Illustrative of the bichromates useful in the compositions of this invention are lithium bichromate, sodium bichromate, potassium bichromate, ammonium bichromate and the like.

It should be noted that the bichromate can be generated from chromate salts in situ by providing excess sulfonic acid. The bichromate ion thus generated will function with the acid to provide an improved tone scale. It should be further noted that the bichromates may not be present as such after the plate has been baked.

The polyhydric phenol component of either phloroglucinol or resorcinol serves to toughen the non-image areas of the printing plate. This is particularly important where non-metallic substrates are to be used. The preferred polyhydric phenol is phloroglucinol as this compound provides the printing plate composition with exceptionally tough non-image areas.

Suitable solvents useful in the coating compositions of this invention are those which serve as solvents for all of the solute ingredients of the compositions in the amounts in which they are present. Illustrative of suitable solvents are dimethyl formamide, acetone/water in a 3:1 ratio, Cellosolve/water in a 4:1 ratio and the like. Dimethyl formamide is the preferred solvent because of its excellent solubility characteristics.

The ratio of components in the photosensitive compositions must be within specific limits in order to obtain satisfactory results when the compositions are employed in the preparation of planographic printing plates. The quantity of ethylene oxide polymer in the compositions can vary between about 0.2 and 3 parts by weight per part of phenolic resin, with the preferred ratio being between about 0.6 and 1.8 parts of ethylene oxide polymer per part of phenolic resin.

The acid component is generally employed in an amount of from 0.006 to 0.05 part by weight per part phenolic resin although amounts of from 0.01 to 0.03 part by weight per part phenolic resin are preferred.

The bichromate component is generally used in an amount of from 0.025 to 0.2 part by weight per part phenolic resin although from 0.10 to 0.14 part by weight per part phenolic resin are preferred.

The polyhydric phenol component is generally used in an amount of from 0.025 to 0.13 part by weight per part phenolic resin. Preferred amounts are from 0.07 to 0.08 part by weight per part phenolic resin.

Preferred amounts of the ingredients indicated are predicated on the optimum degree of toughness, printing capability, photosensitivity, and tone scale in the finished printing plate.

The amount of solvent useful in the coating compositions of this invention is dependent upon the thickness of the printing plate coating desired and viscosity requirements. Generally however, amounts of from 5 to 50 milliliters of solvent are used per gram of the total remaining ingredients i.e. the solutes.

The coating compositions of this invention are easily prepared by dissolving the various ingredients in the solvent.

The planographic printing plate bases of this invention are then easily prepared by coating a suitable substrate with the printing plate coating composition of this invention, drying the coated substrate and then baking the coated substrate at a temperature of about 165° C. for a period of time sufficient to fully insolubilize the coating. This time period is generally about 20 minutes.

The substrate can be of any suitable flat material such as metal, for example aluminum, zinc or steel, plastic, papar cardboard or the like provided they exhibit sufficient flexibility to be mounted on the printing press.

The substrate can be coated with the printing plate coating composition of this invention by any of the conventional techniques known to the art such as whirl coating, roll coating, spraying, knife coating and the like.

After the coated substrate has been oven-baked the plate can be photosensitized by coating the baked printing surface with a suitable photosensitizing agent. Suitable photosensitizing agents are those which when acted upon by light energy at ambient temperatures release free radicals capable of reacting with the resinous components of the printing plate surface. While many such photosensitizers are known to the art it has been found that partially suitable photosensitizers for the compositions of the present invention are the haloalkanes wherein the halogen substituents exhibit an atomic weight greater than 37. The haloalkanes wherein the alkane moiety contains from one to six carbon atoms and the halogen substituent is either iodine or bromine is particularly effective.

Particularly preferred are the polyhaloalkanes wherein more than one halogen atom is substituted on the same carbon atom. Illustrative of useful photosensitizing agents are iodoform, bromoform, methyl iodide, dibromoethane, tetraiodoethane, diiododibromobutane, hexabromohexane, and the like.

The photosensitizing ability of the various alkane iodides or bromides is a function of quantum yield,[1] which in turn depends on the chemical structure of the respective iodides or bromides. Generally, the quantum yield increases as the number of halogen atoms in the compounds increases, and as the length of the hydrocarbon chain increases. The quantum yield is also higher if the iodine atoms are on a tertiary carbon atom rather than a primary or secondary carbon atom. On this basis, the photosensitizing ability of various iodides, in the order of increasing efficiency, is exemplified by the followng sequence:

$$CH_3I<CH_3CH_2I<CH_3(CH_2)_2I<CH_3(CH_2)_3I<(CH_3)_3CI<CH_2I_2<CHI_3$$

Iodoform is a particularly outstanding photosensitizing agent in the practice of the present invention.

The photosensitive component is conveniently coated on the plates as a solution in solvents such as benzene, carbon disulfide, diethyl ether, ethyl acetate, methanol, ethanol, acetone, and the like. The concentration of the photosensitizer in the solvent will control the thickness of the coating and this will influence the time needed for satisfactory exposure in the development of the printing plate. A preferred photosensitizer coating solution consists of between about ½ percent and 10 percent iodoform in acetone. The coating can be applied by wiping on the solution with a cloth, or by pouring onto the plate in a whirler.

The photosensitized printing plate is exposed to a light source through a transparent pattern (e.g., a negative) to form an image on the photosensitive surface. The negative can be either the continuous tone or half-tone type. The light source can be sunlight, carbon-arc light, mercury vapor light or other light source of suitable intensity.

It appears that the image is formed due to the fact that each infinitesimal area of the coating hardens in proportion to the amount of light it receives and consequently becomes proportionally less hydrophilic. As in Collotype printing plates, the various parts of the exposed coating accept water in an amount inversely proportional to the quantity of light they receive. These areas accept a complementary quantity of ink directly proportional to the intensity of light which acted upon the coating. Those areas which received no light absorb a maximum quantity of water during printing and completely repel the greasy ink. Those areas exposed to sufficient light to render them completely hydrophobic absorb the maximum amount of ink, and those areas which during exposure received intermediate amounts of light accept an intermediate amount of ink in proportion to the intensity of light they received. This apparent mechanism of acceptance and rejection of water and ink proportional to light exposure provides the continuous tone nature of the printing plate image and the subsequent reproductions.

Printing plates produced according to the practice of the present invention are capable of providing excellent reproductions in printing processes. The disadvantages of half-tone dot structure techniques described hereinbefore are avoided. The photosensitive compositions of the present invention form printing plates which are tougher and more durable than the gelatin base plates heretofore used in continuous tone printing. The invention photosensitive compositions are also more versatile than the gelatin base plates since the properties of toughness and water receptivity may be readily and reproducibly controlled simply by varying the weight ratio of ethylene oxide polymer to phenolic resin component. Furthermore, the invention compositions absorb and release water more slowly than does gelatin. These more favorable water absorption characteristics permit easily controllable water capacity and provide improved control of color density during a press run. Further, no development of the continuous tone image on the plates after exposure to light is required, thus eliminating the necessity for special chemicals and the necessity for complicated development techniques which must be rigidly controlled within narrow limits.

While not wishing to be bound by any theory of mechanisms, it is believed that the outstanding characteristics of the photosensitive compositions of the present invention as employed in the preparation and use of half-tone and continuous tone photographic printing plates are mainly due to the "association" or "complex" formation between the phenolic resin component and the ethylene oxide polymer component. The term "association" refers to the interaction which provides the binding force between the ethylene oxide polymer component and the phenolic resin component. It is believed that the interaction involves one or more diverse mechanisms such as hydrogen bonding, electrostatic bonding, secondary valence forces, and the like. It appears that the phenomenon concerning hydrogen bonding can best explain the nature of the interaction. The "associating" or "complexing" interaction between the phenolic resin component and the ethylene oxide polymer component in the photosensitive compositions might be visualized in the following manner:

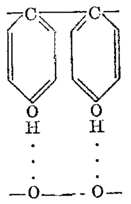

The "association" of the resole resin component and the ethylene oxide polymer component causes the formation of a tough, hydrophilic material when sheeted or molded. The water receptivity of this "association" product declines as the phenolic resin "advances," that is, increases in molecular weight and/or in degree of cross-linking on exposure to light, and the methylol content of the resole resin decreases. Radicals released by the action of light on the photosensitive substance in the composition (for example, iodine radicals released from iodoform) react with the resole phenolic resin to produce intermediate chemical products. These products presumably react with each other as well as with unactivated phenolic molecules to produce "advanced" high molecular weight phenolic derivatives of lower methylol content. This causes the water receptivity of the phenolic resin-ethylene oxide polymer coating to decline in proportion to the radicals produced, which is in turn proportional to the intensity of the light received by a particular portion of the coating during exposure.

The above-postulated mechanisms of interaction are merely theoretical and should not be construed as limiting thereto. Other theories or reasons may equally well explain the true nature of the interaction.

The plastic printing plates of the present invention are superior to the standard metal-base printing plates employed in the lithographic industry. The printing plates of the present invention require no processing in order to develop the exposed plate. If desired, the process can be confined simply to removing excess sensitizer. However, this is not necessary since the action of the molletons of the printing press will effectively remove any excess sensitizer. The printing plates of the present invention are tough and durable and there is no difficulty with the image areas wearing away when subjected to normal pressroom practices. Since the plates can be prepared with a paper or plastic substrate, they are more flexible than metal-base plates and this permits more latitude in storage and greater convenience in mounting on printing presses. The print-

[1] Quantum yield refers to the number of molecules reacting chemically per photon of light absorbed.

ing plates will not kink and they are extremely scratch resistant. Unlike conventional metal-base plates, the non-image areas are not metal. Hence, there is no difficulty with pitting and corrosion, and because there is no graininess, it is possible to print perfect dots in half-tone printing. This particular advantage is illustrated by the fact that negatives of screening of three hundred lines per inch or higher can be employed.

Another significant difference between the printing plates of the present invention and the conventional lithographic diazo printing plates is the fact that the invention plates have a one-phase printing surface while the conventional plates after they are developed have two phases, i.e., the diazo decomposition product phase and the exposed metal-base phase. The plastic-base printing plates of this invention are useful in offset lithographic printing, and in direct printing with standard dampening and inking systems.

In another useful application of the invention plastic-base compositions, ink containing a photosensitizer can be typed onto the plastic-base composition which is suitably flexible, and then the plate is exposed and employed directly for running off copies.

The following examples will serve to illustrate specific embodiments of the invention.

ILLUSTRATION I

This illustration exemplifies the preparation of conventional phenolic resins useful in the practice of the present invention.

*(a) Phenol-formaldehyde resole resin*

A mixture consisting of 1 mole of phenol, 3 moles of paraformaldehyde, 6 moles of water and 0.3 mole of sodium acetate trihydrate is refluxed at atmospheric pressure for a period of time between about two and one-half hours and three and one-half hours until the solution becomes cloudy. Two distinct phases begin to form as the resin precipitates from the refluxing mixture. Heating is continued for an additional five minutes and the hot mixture is then poured into water to completely precipitate the resin. The solid resin is recovered by filtration or decantation or other suitable separation method and washed thoroughly with water. The resin is dissolved in a suitable solvent such as methyl etheyl ketone, and anhydrous sodium sulfate is added to dry the solution. The water free solution is recovered by filtering out the sodium sulfate.

*(b) Meta-cresol–formaldehyde resole resin*

Meta-cresol, paraformaldehyde and sodium acetate trihydrate in a molar ratio of 1:2.5:0.3, respectively, are mixed in water to form a dilute slurry (about 200 milliliters of water per mole of meta-cresol). This mixture is refluxed at atmospheric pressure until resin begins to precipitate, which is normally about a twenty-minute reaction period. The heating is continued an additional five minutes, and the reaction mixture is poured into cold water to completely precipitate the resin. An anhydrous solution of the resin in methyl ethyl ketone is prepared in the same manner as above.

*(c) Resorcinol-formaldehyde resole resin*

A mixture of resorcinol, sodium sulfate and formalin (37 percent solution of formaldehyde in water) in a molar ratio of about 1:0.2:0.8, respectively, is dissolved in water (about 100 milliliters of water per mole of resorcinol). The reaction mixture is heated on a steam bath until the solution turns cloudy, then it is poured into cold water to completely precipitate the resin product. The resin is recovered and prepared as an anhydrous solution in methyl ethyl ketone in the manner described above.

*(d) Phenol-formaldehyde novolak resin*

One hundred grams of phenol is dissolved in 69 grams of 37 percent formalin solution and about 0.55 gram of oxalic acid is added. This mixture is refluxed at a temperature of about 80° C. for a period of about 6 hours at the end of which period the solution becomes cloudy. Water is then distilled from the reaction mixture until the temperature of the resinous mass reaches about 150° C. The resin is then discharged from the reaction vessel and allowed to cool. At room temperature the cooled resin is brittle and is readily pulverized to a powdery state.

Grindable resole resins are also employed in this invention. Such resins are manufactured by refluxing the phenol and formaldehyde in a basic aqueous medium followed by removal of water by distillation. Water is generally removed until the resin is viscous but still pourable from the still. When the resin cools it is grindable.

EXAMPLE I

A printing plate coating composition is prepared having the following composition.

| | |
|---|---|
| Phenolic resin: Resole type having a solids content of 60 percent ________grams__ | 13.5 |
| Ethylene oxide polymer: Poly(ethylene oxide) having an average molecular weight of from 2 to 3 million on a reduced viscosity of from 18–22 measured at a concentration of 0.2 gram in 100 milliliters of water at a temperature of 25° C. ________do____ | 12.0 |
| Solvent: N,N-dimethylformamide ___milliliters__ | 300 |
| Photosensitizing agent: Ammonium chromate [$(NH_4)_2Cr_2O_7$] ________grams__ | 0.9 |
| Acid compound: p-Toluene sulfonic acid monohydrate ________do____ | 0.15 |
| Polyhydric phenol: Phloroglucinol dihydrate_do____ | 0.3 |

All of the ingredients of the composition were charged to a high speed vortex blender and were mixed for a period of about 45 minutes. After the mixing was complete a solution of 0.3 gram of phloroglucinol dihydrate in 300 milliliters of N,N-dimethylformamide was additionally added.

This solution is uniformly spread on a grained aluminum plate by means of a whirl-coated turning at a speed of about 170 revolutions per minute. After the coating is complete and uniform, the coated plate is baked in an oven, having a temperature of 165° C. for a period of about 20 minutes. This plate is then removed from the oven and allowed to cool.

The plate is photosensitized by uniformly coating the baked polymeric surface with an 0.5 percent solution of iodoform in methanol and allowing the plate to air-dry.

A continuous-tone negative having a density range of from about 0.1 to about 1.5 is mounted over the plate, and exposed to a 20 ampere carbon arc light source for a period of about 3 minutes at a distance of about 24 inches.

The exposed plate is then mounted on a conventional offset printing press. Continuous-tone prints made from the plate are of excellent quality.

In a similar manner printing plates are prepared utilizing novolak phenolic resins by merely substituting the novolak resin for the resole resin in the composition of Example I.

Also resorcinol is substituted for phloroglucinol to produce a long wearing planographic printing plate.

What I claim is:

1. A coating composition consisting essentially of (1) an association product of a heat-fusible condensation product of a phenol with an aldehyde and from about 0.2 to 3.0 parts by weight of a water soluble ethylene oxide polymer having an average molecular weight in the range of from 50,000 to about 10,000,000 per part phenolic resin, (2) from about 0.006 to about 0.05 part by weight per part phenolic resin of an organic sulfonic acid containing from 1 to 12 carbon atoms inclusive, (3) from about 0.025 to about 0.2 part by weight per part phenolic resin of a water soluble, inorganic bichromate of the formula $(M)_2Cr_2O_7$ where M is an alkali metal or an ammonium ion, (4) from about 0.025 to about 0.13 part by weight per part phenolic resin of a polyhydric phenol selected from the group consisting of phloroglucinol and resorcinol, and (5) a suitable solvent.

2. The coating composition of claim 1 wherein the organic sulfonic acid is an aromatic sulfonic acid.

3. The coating composition of claim 2 wherein the aromatic sulfonic acid is a toluene sulfonic acid.

4. The coating composition of claim 1 wherein the polyhydric phenol is phloroglucinol.

5. The coating composition of claim 1 wherein the bichromate is an alkali metal bichromate.

6. The coating composition of claim 1 wherein the solvent is dimethylformamide.

7. A coating composition consisting essentially of (1) an association product of a heat-fusible condensation product of a phenol with an aldehyde and from about 0.6 to about 1.8 parts by weight of poly(ethylene oxide) having an average molecular weight in the range of from about 50,000 to about 10,000,000 per part phenolic resin, (2) from about 0.01 to about 0.003 part by weight p-toluene sulfonic acid, (3) from about 0.10 to about 0.14 part by weight of an alkali metal bichromate, (4) from about 0.07 to about 0.08 part by weight of phloroglucinol, and (5) a sufficient amount of dimethylformamide to at least dissolve all the other components of the coating composition.

8. A planographic printing plate base comprising a substrate having coated on at least one of its surfaces a photosensitizable composition consisting essentially of (1) an association product of a heat-fusible condensation product of a phenol with an aldehyde and from about 0.2 to 3.0 parts by weight of a water soluble ethylene oxide polymer having an average molecular weight in the range of from 50,000 to about 10,000,000 per part phenolic resin, (2) from about 0.006 to about 0.05 part by weight per part phenolic resin of an organic sulfonic acid containing from 1 to 12 carbon atoms inclusive, (3) from about 0.025 to about 0.2 part by weight per part phenolic resin of a water soluble, inorganic bichromate of the formula $(M)_2Cr_2O_7$ wherein M is an alkali metal or an ammonium ion, and (4) from about 0.025 to about 0.13 part by weight per part phenolic resin of a polyhydric phenol selected from the group consisting of phloroglucinol and resorcinol.

9. The planographic printing plate base of claim 8 wherein said substrate is a metallic substrate.

10. The planographic printing plate base of claim 8 wherein said substrate is a paper substrate.

11. The planographic printing plate base of claim 8 wherein the organic sulfonic acid is an aromatic sulfonic acid.

12. The planographic printing plate base of claim 8 wherein the polyhydric phenol is phloroglucinol.

13. The planographic printing plate base of claim 8 wherein the bichromate is an alkali metal bichromate.

14. A printing plate base comprising a substrate having coated on at least one of its surfaces a photosensitizable composition consisting essentially of (1) an association product of a heat-fusible condensation product of a phenol with an aldehyde and from about 0.2 to 3.0 parts by weight of a water soluble ethylene oxide polymer having an average molecular weight in the range of from 50,000 to about 10,000,000 per part phenolic resin, (2) from about 0.006 to about 0.05 part by weight per part phenolic resin of an organic sulfonic acid containing from 1 to 12 carbon atoms inclusive, (3) from about 0.025 to about 0.2 part by weight per part phenolic resin of a water soluble, inorganic bichromate, and (4) from about 0.025 to about 0.13 part by weight per part phenolic resin of a polyhydric phenol selected from the group consisting of phloroglucinol and resorcinol.

15. A photosensitive planographic printing plate comprising the printing plate base of claim 8 wherein the surface of the photosensitizable composition has been coated with a haloalkane containing from 1 to 6 carbon atoms and wherein said halogen has an atomic weight greater than 37.

16. The photosensitive planographic printing plate of claim 15 wherein said haloalkane is iodoform.

17. The photosensitive planographic printing plate of claim 15 wherein said haloalkane is bromoform.

18. A photosensitive planographic printing plate comprising the printing plate base of claim 14 wherein the surface of the photosensitizable composition has been coated with a polyhaloalkane containing from 1 to 6 carbon atoms and wherein each of said halogens has an atomic weight greater than 37.

19. Th photosensitive planographic printing plate of claim 18 wherein the polyhaloalkane is iodoform.

20. The photosensitive planographic printing plate of claim 18 wherein the polyhaloalkane is bromoform.

No references cited.

NORMAN G. TORCHIN, *Primary Examiner.*

RONALD SMITH, *Assistant Examiner.*